United States Patent
Toft et al.

(10) Patent No.: US 11,553,283 B2
(45) Date of Patent: Jan. 10, 2023

(54) MICROPHONE ASSEMBLY HAVING A DIRECT CURRENT BIAS CIRCUIT WITH DEEP TRENCH ISOLATION

(71) Applicant: Knowles Electronics, LLC, Itasca, IL (US)

(72) Inventors: Jakob Toft, Itasca, IL (US);
Mohammad Shajaan, Værløse (DK);
Mohsin Nawaz, Itasca, IL (US);
Michael Pedersen, Itasca, IL (US)

(73) Assignee: Knowles Electronics, LLC, Itasca, IL (US)

( * ) Notice: Subject to any disclaimer, the term of this patent is extended or adjusted under 35 U.S.C. 154(b) by 118 days.

(21) Appl. No.: 17/130,512

(22) Filed: Dec. 22, 2020

(65) Prior Publication Data

US 2021/0195342 A1    Jun. 24, 2021

Related U.S. Application Data

(60) Provisional application No. 62/953,072, filed on Dec. 23, 2019.

(51) Int. Cl.
*H04R 19/00* (2006.01)
*H04R 19/04* (2006.01)
*H02M 3/07* (2006.01)

(52) U.S. Cl.
CPC .............. *H04R 19/04* (2013.01); *H02M 3/07* (2013.01); *H04R 2201/003* (2013.01)

(58) Field of Classification Search
CPC .............. H04R 19/04; H04R 2201/003; H04R 19/005; H04R 17/02; H04R 1/04; H04R 3/00; H02M 3/07; H01L 23/58; H01L 27/0251
See application file for complete search history.

(56) References Cited

U.S. PATENT DOCUMENTS

| | | | |
|---|---|---|---|
| 7,190,038 B2 | 3/2007 | Dehe et al. | |
| 7,473,572 B2 | 1/2009 | Dehe et al. | |
| 7,781,249 B2 | 8/2010 | Laming et al. | |
| 7,795,695 B2 | 9/2010 | Weigold et al. | |
| 7,825,484 B2 | 11/2010 | Martin et al. | |
| 7,829,961 B2 | 11/2010 | Hsiao | |
| 7,856,804 B2 | 12/2010 | Laming et al. | |
| 7,903,831 B2 | 3/2011 | Song | |
| 8,170,237 B2* | 5/2012 | Shajaan | H04R 19/04 381/112 |
| 2005/0207605 A1 | 9/2005 | Dehe et al. | |
| 2007/0160234 A1* | 7/2007 | Deruginsky | H04R 3/00 381/113 |
| 2007/0278501 A1 | 12/2007 | MacPherson et al. | |
| 2008/0175425 A1 | 7/2008 | Roberts et al. | |

(Continued)

*Primary Examiner* — Matthew A Eason
(74) *Attorney, Agent, or Firm* — Foley & Lardner LLP

(57) ABSTRACT

The disclosure describes devices and methods of providing a DC bias voltage in a microphone assembly. Particularly, one implementation of such a device may be implemented on an integrated circuit that includes a direct current (DC) bias circuit. The DC bias circuit may be coupled to a transducer and configured to supply a DC bias signal to the transducer. The DC bias circuit includes a multi-stage charge pump and a low pass filter (LUFF) circuit. The multi-stage charge pump includes transistors that are fabricated with deep trench isolation (DTI).

20 Claims, 14 Drawing Sheets

(56) References Cited

U.S. PATENT DOCUMENTS

| | | | |
|---|---|---|---|
| 2008/0267431 A1 | 10/2008 | Leidl et al. | |
| 2008/0279407 A1 | 11/2008 | Pahl | |
| 2008/0283942 A1 | 11/2008 | Huang et al. | |
| 2009/0001553 A1 | 1/2009 | Pahl et al. | |
| 2009/0180655 A1 | 7/2009 | Tien et al. | |
| 2010/0046780 A1 | 2/2010 | Song | |
| 2010/0052082 A1 | 3/2010 | Lee et al. | |
| 2010/0128914 A1 | 5/2010 | Khenkin | |
| 2010/0183181 A1 | 7/2010 | Wang | |
| 2010/0246877 A1 | 9/2010 | Wang et al. | |
| 2010/0290644 A1 | 11/2010 | Wu et al. | |
| 2010/0322443 A1 | 12/2010 | Wu et al. | |
| 2010/0322451 A1 | 12/2010 | Wu et al. | |
| 2011/0013787 A1 | 1/2011 | Chang | |
| 2011/0075875 A1 | 3/2011 | Wu et al. | |
| 2012/0293216 A1* | 11/2012 | Muza | H02M 3/158 327/109 |
| 2013/0093503 A1* | 4/2013 | Kok | H02M 3/07 327/536 |
| 2016/0099638 A1* | 4/2016 | Ersoy | H02M 3/073 381/113 |
| 2017/0133842 A1* | 5/2017 | Freeman | H02J 7/0068 |
| 2017/0170163 A1* | 6/2017 | Choy | H01L 27/1203 |
| 2018/0012588 A1* | 1/2018 | Albers | H02M 3/07 |

* cited by examiner

MICROPHONE ASSEMBLY HAVING A DIRECT CURRENT BIAS CIRCUIT WITH DEEP TRENCH ISOLATION

CROSS-REFERENCE TO RELATED APPLICATIONS

The present application claims priority to and benefit of U.S. Provisional Application No. 62/953,072 filed Dec. 23, 2019, the disclosure of which is hereby incorporated by reference herein in its entirety.

FIELD OF THE DISCLOSURE

The present disclosure relates generally to microphone assemblies, such as, but not limited to, those with microelectromechanical systems (MEMS) transducers and electrical circuits therefor.

BACKGROUND

Microphones having a transducer that convert sound into an electrical signal conditioned or processed by an integrated circuit are commonly integrated with cell phones, personal computers and internet of things (IoT) devices, among other host devices. Some such transducers require the application of a direct current (DC) bias voltage for operation. Increased bias voltages are required to enable the continued evolution of transducer technologies.

BRIEF DESCRIPTION OF THE DRAWINGS

The objects, features and advantages of the present disclosure will become more fully apparent from the following description and appended claims, taken in conjunction with the accompanying drawings. The drawings depict only representative embodiments and are therefore not considered to limit the scope of the disclosure, the description of which includes additional specificity and detail.

DETAILED DESCRIPTION

The present disclosure describes microphone assemblies and other devices including a DC bias circuit having deep trench isolation (DTI) and an output connected to an input of a transducer of the microphone or other device and methods therefor. Microphone assemblies having smaller and smaller footprints are increasingly demanded. A microphone assembly including a small microelectromechanical (MEMS) module (e.g., transducer) that has low mechanical compliance may allow for the MEMS module to exhibit desirable properties such as force balancing and/or extreme miniaturization. However, the low mechanical compliance may limit the sensitivity and signal to noise ratio (SNR) of the microphone assembly. In order to increase the sensitivity and SNR, a DC bias voltage may be increased such that the electric field in the microphone is also increased. However, increasing the DC bias voltage is limited by the breakdown voltages of the transistors within the DC bias circuit and the available space within the microphone assembly. Thus, the present disclosure describes a DC bias circuit that can output voltages of over 50 volts while maintaining a small footprint.

The DC bias circuit may include multiple transistors. Each of the transistors are formed, disposed, or created within either an N-well or a P-well within a substrate (e.g., a P-type substrate). The breakdown voltage of the transistors (e.g., breakdown voltage of the N-wells and the P-wells between the substrate) impose a limit on how high of voltages a charge pump can be designed to generate. The limit is imposed because voltages above the breakdown voltage will lead to excessive leakage to the substrate, which will reduce the output voltage of the charge pump and/or damages the circuits on the integrated circuit. The deep trench isolation achieves better horizontal and vertical insulation between the N-wells and P-wells) and increases the breakdown voltage. The devices and methods disclosed herein may be used to increase the DC bias voltage of the DC bias circuit to voltages above 50 volts in order to increase sensitivity and signal to noise ratios (SNRs) in microphone assemblies having a transducer with a low mechanical compliance.

Figure 1:
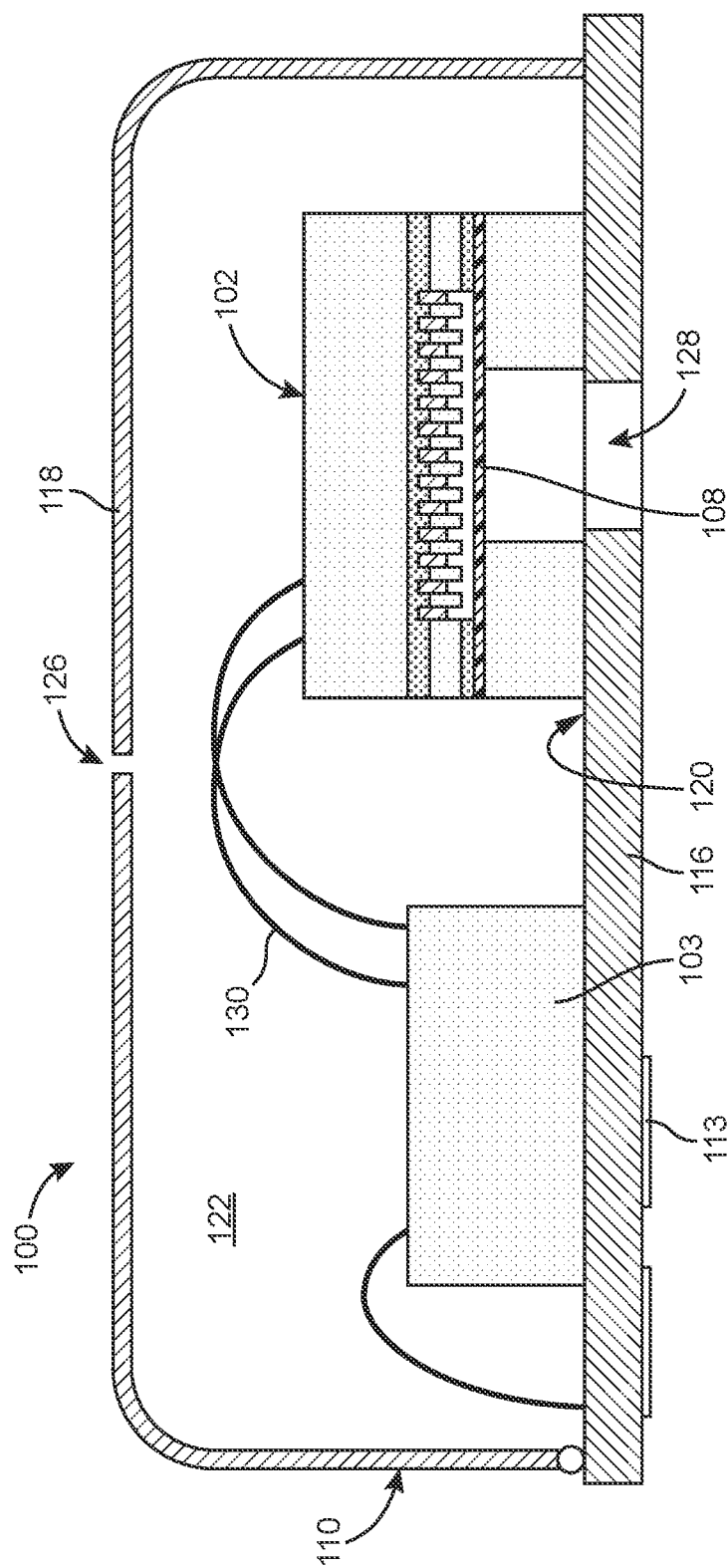
FIG. 1 is a cross-sectional view of a microphone assembly.

FIG. 1 is a cross-sectional view of a microphone assembly 100 in which a DC bias circuit having DTI is implemented. The microphone assembly 100 generally includes an electroacoustic transducer 102 coupled to an electric circuit 103 disposed within a housing 110. The transducer is configured to generate an electrical signal in response so sensing acoustic activity. The transducer may be a capacitive, piezoelectric or other transduction device implemented using microelectromechanical systems (MEMS) fabrication or other known or future technology. The electrical circuit may be embodied by one or more integrated circuits, for example, an application specific integrated circuit (ASIC) with analog and digital circuits and a discrete digital signal processor (DSP) that performs audio processing (e.g., keyword/command detection, noise suppression, authentication . . . ).

The housing 110 includes a substrate 116 and a cover 118 coupled to an upper surface 20 of the substrate 116. The cover 118 is secured to the substrate 116 along a perimeter of the cover 18. Together, the cover 118 and the substrate 116 define an interior portion 122 (e.g., hollow cavity, etc.). The cover 118 may include an atmospheric equalization vent 126 (e.g., opening, hole, etc.) that provides fluid communication between an environment surrounding the housing 110 and the interior portion 122. The atmospheric equalization vent 126 prevents damage to the housing 110 and/or other components of the microphone assembly 110 that might otherwise occur due to extreme temperature and/or pressure fluctuations in the environment surrounding the microphone assembly 110.

The substrate 116 includes a sound port 128 that is aligned with the MEMS transducer 100 such that the MEMS transducer 100 is exposed to pressure changes through the sound port 128. The relative position between the MEMS transducer 100 and the sound port 128 may differ in various illustrative embodiments. For example, the sound port 128 may be formed into the cover 118 rather than the substrate 116 and the transducer 102 may be adjacent to the sound port 128. In these cases, the transducer 102 may be inverted from that shown in FIG. 1.

The transducer 102 generates electrical signals based on pressure changes communicated to the transducer 102 through the sound port 128 (e.g., via movement or displacement of a diaphragm 108). The pressure changes may be changes in the ambient atmospheric pressure (e.g., a pressure of the environment surrounding the microphone assembly 110) and/or pressure changes caused by an acoustic stimulus such as sound. The electric circuit 103 is coupled to the transducer 102 via leads and traces 130 to form an electrical connection therebetween. The electric circuit 103 is configured to receive and process signals produced by the transducer 102. The signal from the transducer 102 can be processed into an output signal representative of the sensed acoustic activity by the electric circuit 103. The electric circuit 103 may include a signal conditioning circuit, clock circuit, a direct current (DC) bias circuit, one or more low pass filters, and a controller, examples of which are described below. In some embodiments, a DC bias is applied to a first terminal of the transducer via leads and traces 130 from the electric circuit 103. In some embodiments, the signal conditioning circuit is configured to condition an electrical signal obtained from the transducer 102 when the electric circuit 103 is coupled to the transducer 103.

The housing 110 may include a sound port 180 and an external device interface 113 with contacts (e.g., for power, data, ground, control, external signals etc.) to which the electrical circuit 103 is coupled. The external device interface 113 is configured for surface or other mounting to a host device (e.g., by reflow soldering). In some embodiments, the host device may be an amplification device configured to amplify and project an audio signal using the electrical signal generated by the transducer 102. In some embodiments, the host device may include a personal computer, a cellular phone, a mobile device, a headset, a headphone device, and/or a hearing aid device. In some implementations, the electrical circuit 103 includes acoustic signal and atmospheric signal processing circuitry and/or software to interpret the electrical signal from the MEMS transducer 100.

Figure 2:
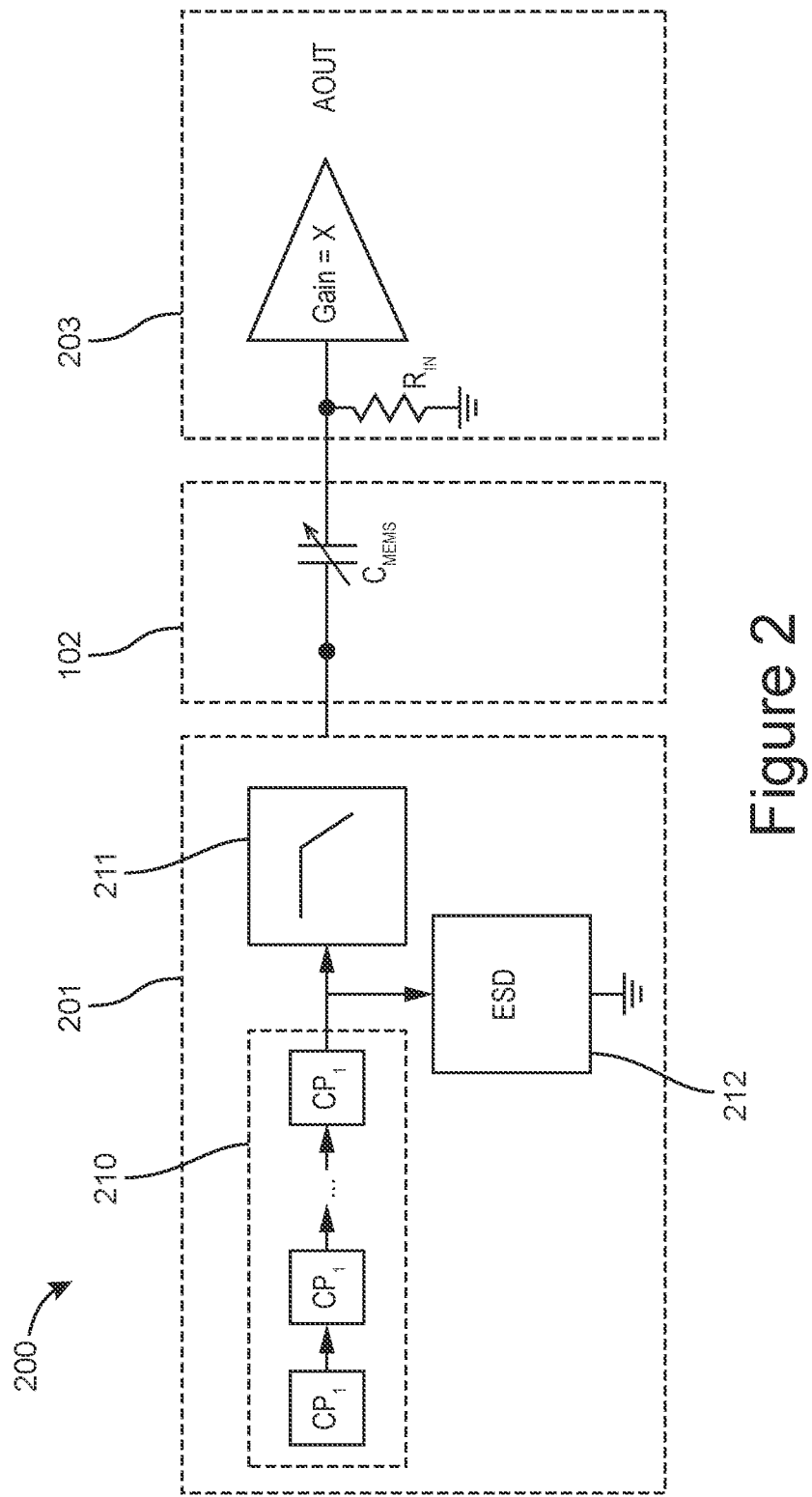
FIG. 2 is a schematic diagram of an audio circuit.

FIG. 2 is a schematic diagram of an audio circuit 200 is shown. The audio circuit 200 generally includes a DC bias circuit 201, the transducer 102, and an amplification circuit 203. In some embodiments, DC bias circuit 201 and the amplification circuit 203 are integrated into the electric circuit 103. In some embodiments, the amplification circuit 203 may be part of the host device. In some embodiments, the amplification circuit 203 may be a signal conditioning circuit that includes a buffer, high pass filter, and/or an analog to digital converter (e.g., in digital microphones.)

The DC bias circuit 201 is arranged to provide a DC bias signal to the transducer 102. In some embodiments, the DC bias circuit 201 includes a multi-stage charge pump circuit 210 and a low pass filter (LPF) circuit 211. In some embodiments, the DC bias circuit 201 further includes an electrostatic discharge (ESD) circuit 212 coupled to an output of the DC bias circuit 201 and ground (e.g., a second voltage) and configured to discharge the electrostatic charges.

In some embodiments, DC bias circuit 201 may include other types of DC amplifying circuits as an alternative or in addition to the multi-stage charge pump circuit 210. The multi-stage charge pump 210 is configured to convert a DC voltage to an output DC voltage that is higher in magnitude. For example, the multi-stage charge pump circuit 210 may have an input from a battery or other power source that is around 5 volts and the output of the multi-stage charge pump circuit 210 may have an output that is 50 volts or higher. In some embodiments, the increase in DC voltage from the input to the output of the multi-stage charge pump circuit 210 is based on the number of charge pump stages $CP_{1-N}$ or other DC amplifying circuits within the multi-stage charge pump circuit 210. The LPF 211 is arranged to receive a signal from the output of the multi-stage charge pump circuit 210 and output the DC bias signal to a first terminal of the transducer 102. In some embodiments, where the mechanical compliance of the transducer 102 is small, the output voltage of the DC bias circuit 201 may be increased in order for the microphone assembly to have increased sensitivity and SNR.

The transducer 102 is arranged to receive the DC bias signal from the DC bias circuit 201 and to generate an electrical signal that is indicative of sensed acoustic energy. The electrical signal is generated with the DC bias signal as a reference voltage. For example, the DC bias signal may be 55 volts (V), and the electrical signal generated by the transducer 102 may be a signal within the range of a few millivolts (mV) to a few hundred millivolts (e.g., 0.001 mV-100 mV.) The electrical signal is then provided to the amplification circuit 203 (or electric circuit 103). As one example, the electrical signal may be amplified by the amplification circuit 203 and transmitted further processed by an analog to digital converter such as to create a digital representation of the electrical signal and the acoustic activity that the electrical signal represents.

Figure 3:
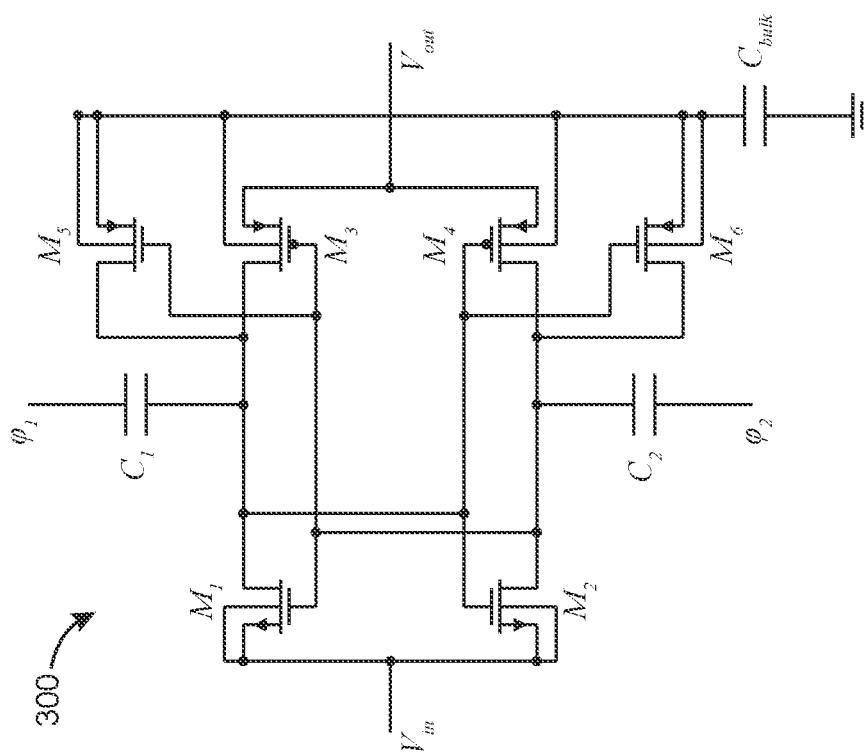
FIG. 3 is a schematic diagram of an example of a charge pump stage.

FIG. 3 is a schematic diagram of one example of a charge pump stage 300. In some embodiments, the charge pump stage 300 may be implemented as one of the multiple charge pump stages $CP_{1-N}$ of the may be the DC bias circuit 201 of FIG. 2. It is to be appreciated that in other embodiments, other types, forms, or configurations of charge pump stages may be implemented. For example, in some embodiments, a charge pump stage may be implemented with one or more capacitors and one or more semiconductor devices. In some embodiments, the one or more semiconductor devices may include one or more diodes and/or one or more transistors.

The charge pump stage 300 includes an input $v_{in}$, multiple transistors $M_{1-6}$, a first capacitor $C_1$, a second capacitor $C_1$, and an output $v_{out}$. The charge pump stage 300 is configured to connect to a clock circuit via a first terminal $\varphi_1$ and a second terminal $\varphi_2$. The clock circuit is used to drive the charge pump stage 300. In some embodiments, the clock circuit generates a two phase, non-overlapping signal with one phase configured to be supplied to the first terminal $\varphi_1$ and a second phase configured to be supplied to the second terminal $\varphi_2$. In other embodiments, more than two phases may be implemented. The charge pump stage 300 receives an input DC voltage at the input $v_{in}$ and outputs a DC voltage that is higher in magnitude than the input DC voltage at the output $v_{out}$. In some implementations, the output $v_{out}$ of the charge pump stage 300 may be connected to an input of a second charge pump stage 300 such that the charge pump stages are cascaded and an output DC voltage of the multiple charge pump stages may reach higher voltages.

Figure 4:
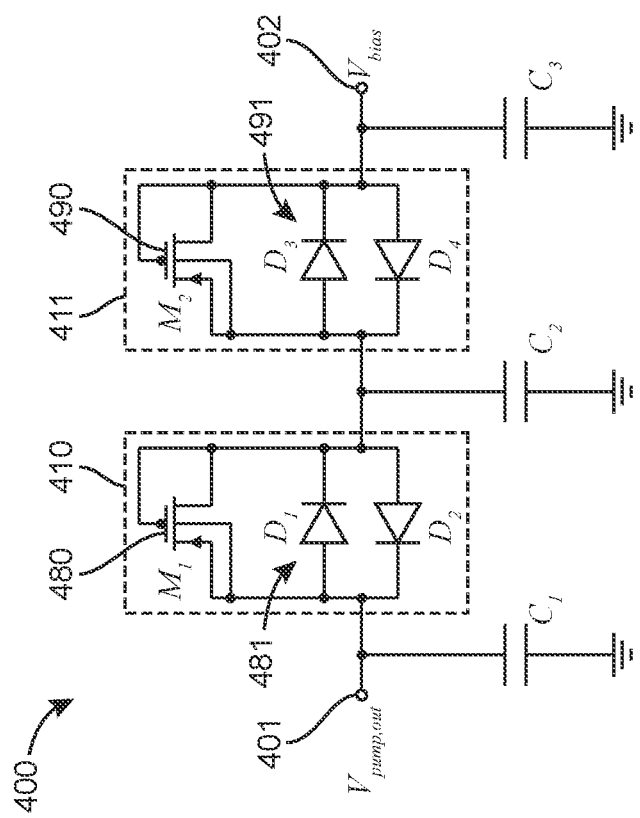
FIG. 4 is a schematic diagram of an example of a low pass filter circuit.

FIG. 4 is a schematic diagram of one example of a LPF circuit 400. In some embodiments, the LPF circuit 400 may be implemented as the LPF circuit 211 of FIG. 2. It is to be appreciated that in other embodiments, other types or forms of low pass filters or sub-circuits thereof may be implemented in addition to or alternative to the LPF circuit 400.

The LPF circuit 400 includes an input 401 that is configured to be coupled to an output of a multi-state charge pump circuit and an output 402 that is configured to be coupled to a first terminal of the transducer 102. The LPF circuit 400 is configured to provide the DC bias voltage $v_{bias}$ to the transducer 102. The LPF circuit 400 may have a first LPF stage 410 and a second LPF stage 411. In some embodiments, the LPF circuit 400 may only have one LPF stage. In some embodiments, the LPF circuit 400 may have more than two LPF stages. The LPF circuit 400 includes a first capacitor $C_1$ coupled between the input 401 and ground (e.g., second voltage), a second capacitor $C_2$ coupled between the connection of first and second LPF stages 410 and 411 and ground (e.g., second voltage), and a third capacitor coupled between the output 402 and ground (e.g., second voltage). In some embodiments, the values of the capacitors $C_{1-3}$ may be selected based on the desired, pre-determined cutoff frequency of the LPF circuit 400.

The first LPF stage 410 includes a transistor 480 connected in parallel with a pair of reverse polarity connected diodes 481. The reverse polarity connected diodes 481 includes a first diode with an anode terminal connected to a cathode terminal of a second diode and a cathode terminal of the first diode connected to an anode terminal of the second diode. The transistor 480 has a control terminal (e.g., gate terminal) connected to a second terminal 483 of the first LPF stage 410 and to a first terminal of the transistor 480. The second LPF stage 411 includes a transistor 490 connected in parallel with a pair of reverse polarity connected diodes 491. The reverse polarity connected diodes 491 includes a first diode with an anode terminal connected to a cathode terminal of a second diode and a cathode terminal of the first diode connected to an anode terminal of the second diode. The transistor 490 has a control terminal (e.g., gate terminal) connected to the output 402 of the LPF circuit 400 and to a first terminal of the transistor 490.

Figure 5:
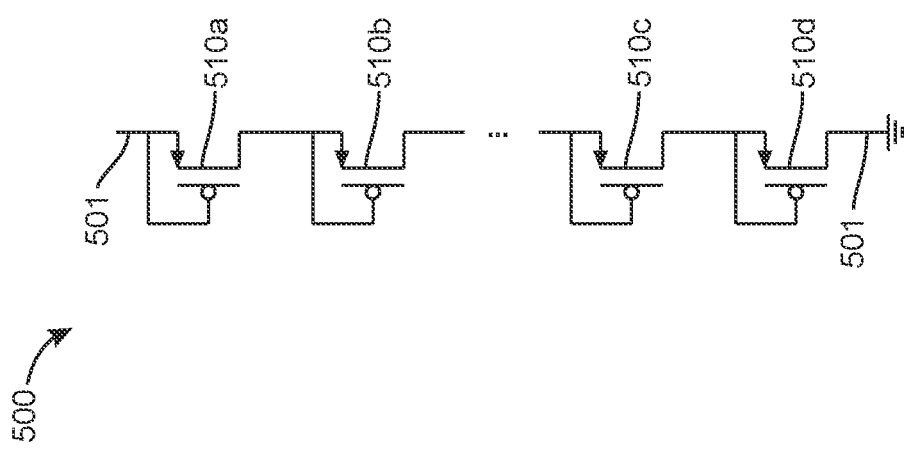
FIG. 5 is a schematic diagram of an example of an electrostatic discharge circuit.

FIG. 5 is a schematic diagram of one example of an electrostatic discharge (ESD) circuit 500. In some embodiments, the ESD circuit 500 may be implemented as the ESD circuit 212 of FIG. 2. It is to be appreciated that in other embodiments, other types or forms of ESD circuits or sub-circuits thereof may be implemented in addition to or alternative to the ESD circuit 500.

The ESD circuit 500 includes a first terminal 501 that is configured to be connected to an output of a multi-stage charge pump circuit and a second terminal 502 configured to be connected to ground (e.g., a second voltage). The ESD circuit 500 may include multiple transistors 510*a-d* stacked between the first terminal 502 and ground. The multiple transistors 510*a-d* may be stacked via connecting each of the multiple transistors 510*a-d* in series between the first terminal 501 and the second terminal 502. In some embodiments, each of the multiple transistors have a control terminal (e.g., gate terminal) connected to a respective first terminal. In some embodiments, each of the multiple transistors 510*a-d* are PMOS transistors. In some embodiments, each off the multiple transistors 510*a-d* include a signal inversion (e.g., a NOT gate) on the respective control terminals. In this way, when the voltage on the first terminal drops by a predetermined voltage or below a predetermined voltage, each of the multiple transistors 510*a-d* of the ESD circuit 500 begin to conduct, thereby electrically discharging the first terminal 501. In some embodiments, each of the multiple transistors 510*a-d* are NMOS transistors. The number of the multiple transistors 510*a-d* used or stacked together will depend on the particular implementation and design of the DC bias circuit. Each of the multiple transistors 510*a-d* may be fabricated in various P-wells or N-wells as described herein. In some embodiments, the multiple transistors 510*a-d* are fabricated with a DTI around each transistor (e.g., or around each N-well or P-well) such that the transistors have a breakdown voltage that is sufficient to ensure that the ESD circuit 500 does not breakdown or have leakage currents while the microphone assembly is in operation.

Generally now referring to FIGS. 6-14, multiple different views of multiple transistor processes are depicted. FIGS. 6, 9, 11, and 13 depict side cutaway view of a respective transistor processes. FIGS. 7-8, 10, 12, and 14 depict top views of respective transistor processes. An example of a charge pump stage 300 as discussed in reference to FIG. 3 is referred to in tandem with the description of FIGS. 6-14 and reproduced for reference in FIGS. 6, 9, and 11. In some embodiments, the P-well region may refer to a region embedded within a substrate that is doped with a P-type material and the N-well region may refer to a region embedded within a substrate that is doped with an N-type material.

Figure 6:
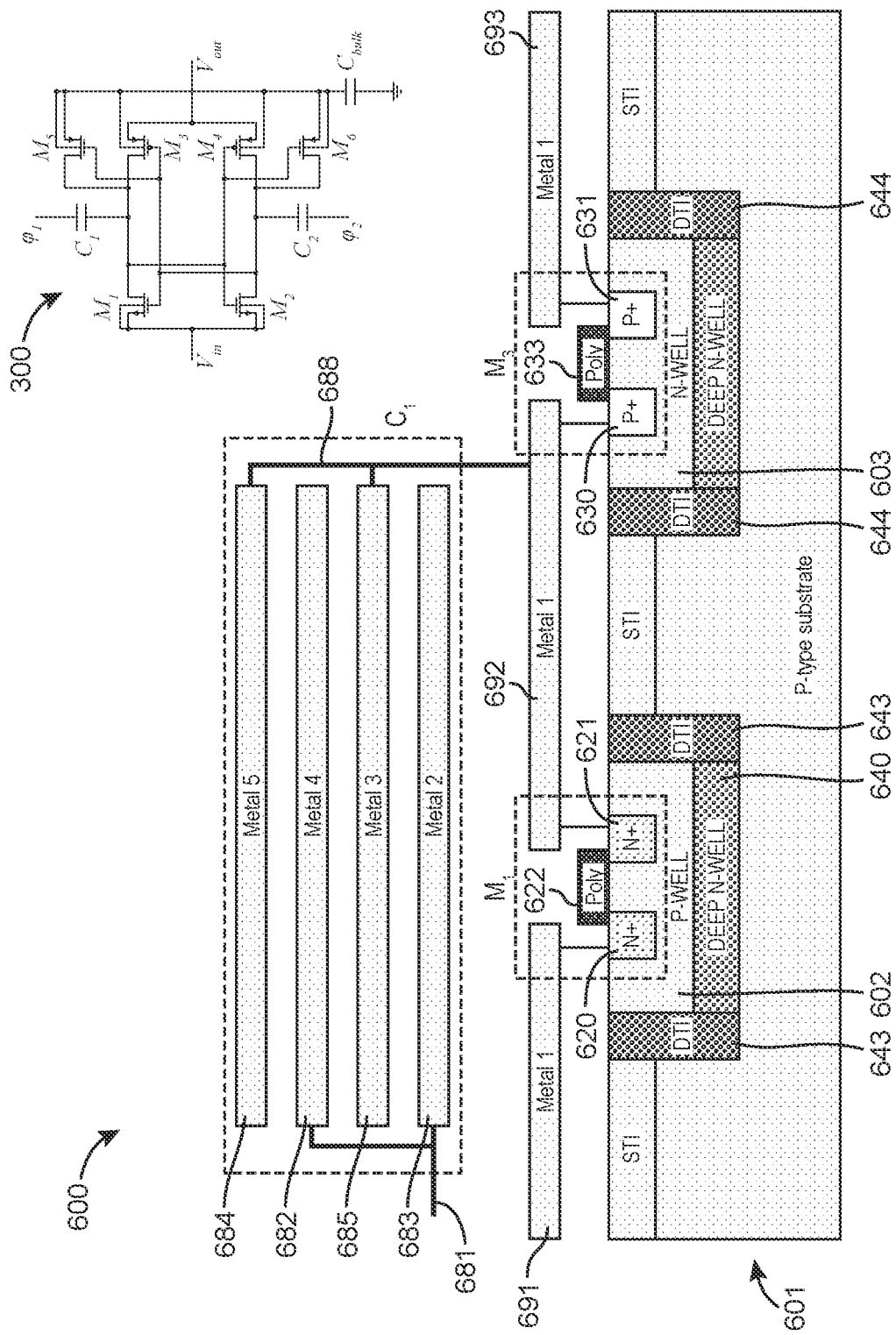
FIG. 6 is a side-cutaway view of a first transistor process including deep trench isolation (DTI).

Referring now to FIG. 6, a transistor process with deep trench isolation (DTI) 600 is depicted. The transistor process with DTI 600 includes a P-type substrate 601 having a P-well 602 and an N-well 603. A first transistor $M_1$ is formed in the P-well 602 with a first N+ pad 620 and a second N+ pad 621 disposed within the P-well 602 a distance apart and being connected by a poly substrate 622. A second transistor $M_3$ is formed in the N-well 603 a first P+ pad 630 and a second P+ pad 631 disposed within the N-well 603 a distance apart and being connected by a poly substrate 633. Alternatively or additionally, the first transistor $M_1$ and the second transistor $M_3$ may be configured such that the second transistor is $M_3$ is formed within the P-well 602 and the first transistor $M_1$ is formed within the N-well. Additionally, in some embodiments, the P-type substrate 601 may be implemented as an N-type substrate. That is, the explanation of the various components of FIG. 6 are meant to be illustrative and in alternative embodiments, other doping configurations and configurations of additional or fewer of the various components are possible. The P+ and N+ pads may refer to areas or regions located within the respective N-well and P-well regions that are doped within either P-type materials or N-type materials, respectively.

In FIG. 6, the transistor process with deep trench isolation (DTI) 600 also includes a first deep N-well 640, a second deep N-well 641, a first DTI 643, and a second DTI 644. The first deep N-well 640 is located adjacent to the P-well 602 between a side of the P-well 602 and the P-type substrate 601. The first DTI 643 is disposed about the perimeter of the P-well 602 between the P-well 602 and the P-type substrate 601. In some embodiments, the first DTI 643 also is disposed about the perimeter of the first deep N-well 640 such that the perimeter of the first deep N-well 640 is separated from the P-type substrate 601 via the first DTI 643. The second deep N-well 641 is located adjacent to the N-well 603 between a side of the N-well 603 and the P-type substrate 601. The second DTI 644 is disposed about the perimeter of the N-well 603 between the N-well 603 and the P-type substrate 601. In some embodiments, the second DTI 644 also is disposed about the perimeter of the second deep N-well 641 such that the perimeter of the first deep N-well 640 is separated from the P-type substrate 601 via the second DTI 644.

In other words, the first DTI 643 is disposed about or around the first transistor $M_1$ and the second DTI 644 is disposed about or around the second transistor $M_2$. The first DTI 643 prevents a voltage on the first transistor $M_1$ (e.g., a voltage on either the first pad 620 or the second pad 621) from breaking down to the P-type substrate 601. The second DTI 644 prevents a voltage on the second transistor $M_2$ (e.g., a voltage on either the first pad 630 or the second pad 631) from breaking down to the P-type substrate 601. In other words, the first and second DTI 643 and 644 increase the electrical insulation around the respective transistors, which increases a threshold for the breakdown voltage of the respective transistors (e.g., the breakdown voltage off the P-well 602 and N-well 603). The breakdown voltage of the P-well 602 and the N-well 603 impose a limit on how high voltages a charge pump can be designed to generate. Thus, the DTI disposed about or around respective transistors $M_1$ and $M_2$ allow for higher DC voltages (e.g., 50-200 volts) to be created, which may be used to increase the sensitivity and SNR of a microphone assembly.

Similar to the transistors depicted in the charge pump stage 300, a first terminal (e.g., the first pad 620) of the first transistor $M_1$ may be electrically coupled to an input $v_{in}$ of the charge pump stage 300 via connection 691. Additionally, a second terminal (e.g., the second pad 621) of the first transistor $M_1$ may be electrically coupled to a first terminal (e.g., the first pad 630) of the second transistor $M_3$ and a first terminal of a first capacitor $C_1$ via connection 692. A second terminal (e.g., second pad 631) of the second transistor $M_2$ may be electrically coupled to the output $v_{out}$ of the charge pump stage 300 via connection 693. In some embodiments, a third transistor $M_2$ is formed similarly to the first transistor $M_1$ and a fourth, fifth and sixth transistor $M_{4-6}$ is formed similarly to the second transistor.

The first capacitor $C_1$ may be formed or created using any known process or as any variety of type of capacitor. In some embodiments, the first capacitor $C_1$ includes a first terminal 681 configured to be connected to one phase of a clock. The first capacitor $C_1$ also includes a first metal plate 682 and a second metal plate 683 electrically coupled to the first terminal 681. The first metal plate 682 disposed between a third metal plate 684 and a fourth metal plate 685 having a dielectric median therebetween. The second metal plate 683 disposed between an outer edge and the fourth metal plate 685, the fourth metal plate 695 and the second metal plate 683 having a dielectric therebetween. The third metal plate 684 and the fourth metal plate 685 being electrically coupled to a second terminal 688 of the first capacitor $C_1$. In some embodiments, the second capacitor $C_2$ of the charge pump stage 300 may be formed or fabricated similarly to the first capacitor $C_1$.

Figure 7:
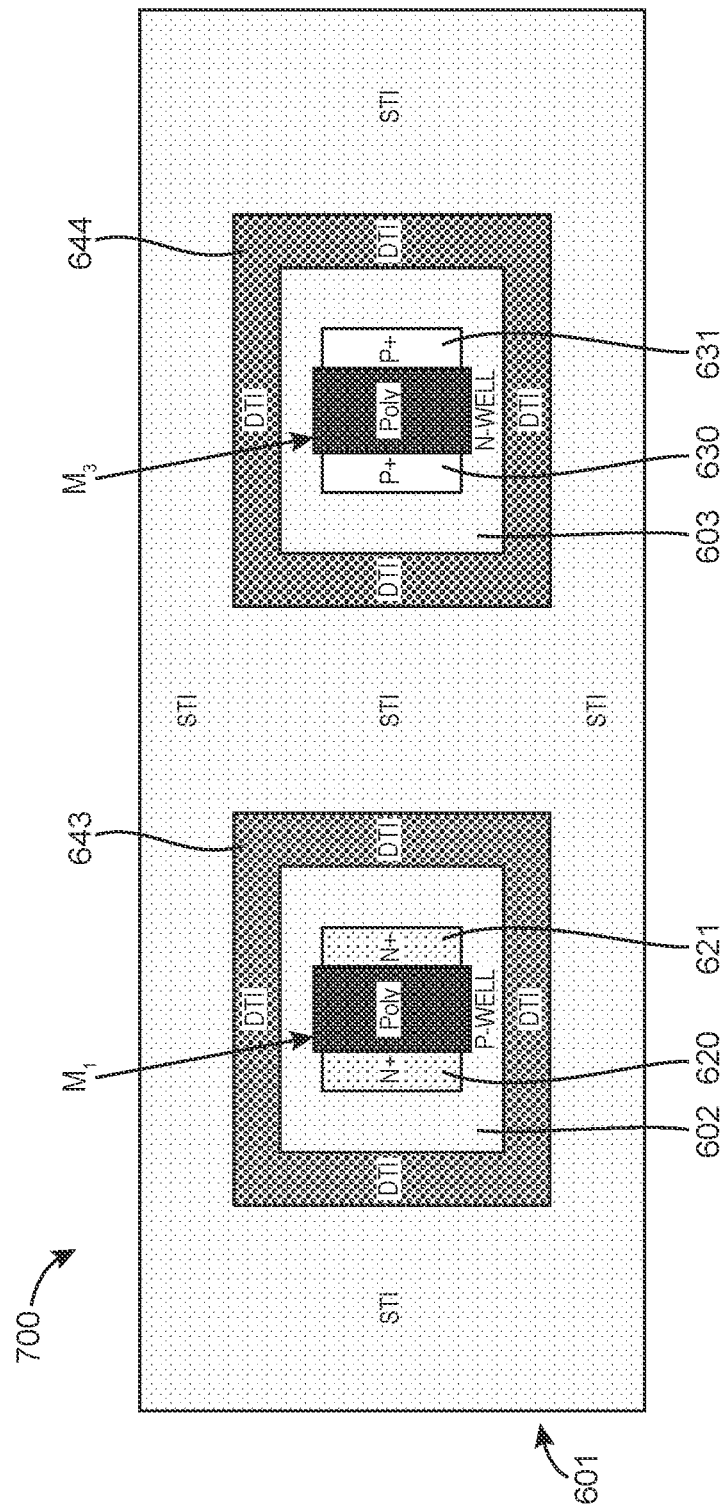
FIG. 7 is a top view of the substrate from FIG. 6.

Referring now to FIG. 7, a top view of a transistor process 700 similar to the process depicted in reference to FIG. 6 is shown. For example, the top view of the transistor process with DTI 700 includes the P-type substrate 601 having the P-well 602 and the N-well 603. The first transistor $M_1$ is disposed or formed within the P-well 602 and the second transistor $M_3$ is disposed or formed within the N-well 603. The first DTI 643 is disposed about or around the first transistor $M_1$ (e.g., and the P-well 602) such as to electrically insulate the P-well 602 from the P-type substrate. The second DTI 644 is disposed about or around the second transistor $M_3$ such as to electrically insulate the N-well 603 from the P-type substrate.

Figure 8:
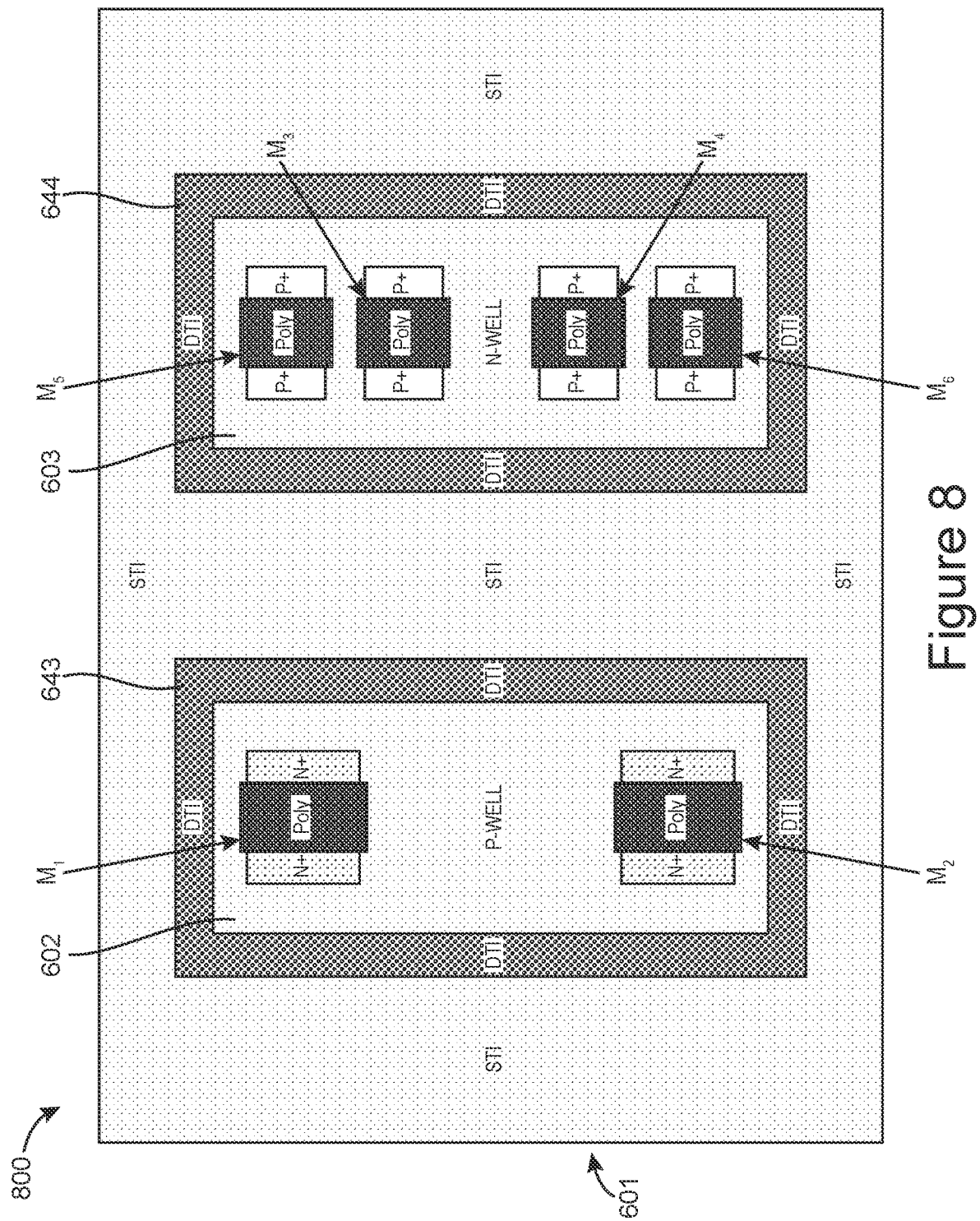
FIG. 8 is a top view of the substrate from FIG. 6 including multiple transistors from the charge pump stage of FIG. 3.

FIG. 8 depicts a top view of the transistor process 800 similar to the process depicted in reference to FIG. 6 and includes the multiple transistors from the charge pump stage 300. The transistor process 800 includes the P-type substrate 601, a P-well 602, and an N-well 603. The transistors $M_1$ and $M_2$ are disposed or formed within the P-well 602 region and the transistors $M_3$, $M_4$, $M_5$, and $M_6$ are disposed or formed within the N-well 603. The first DTI 643 is disposed around the entire N-well (e.g., both transistors $M_1$ and $M_2$). The second DTI 644 is disposed around the entire P-well (e.g., around all the transistors $M_3$, $M_4$, $M_5$, and $M_6$. Alternatively or additionally, in some embodiments, each transistor $M_{1-6}$ may have a respective DTI that is disposed about or around each transistor individually.

Figure 9:
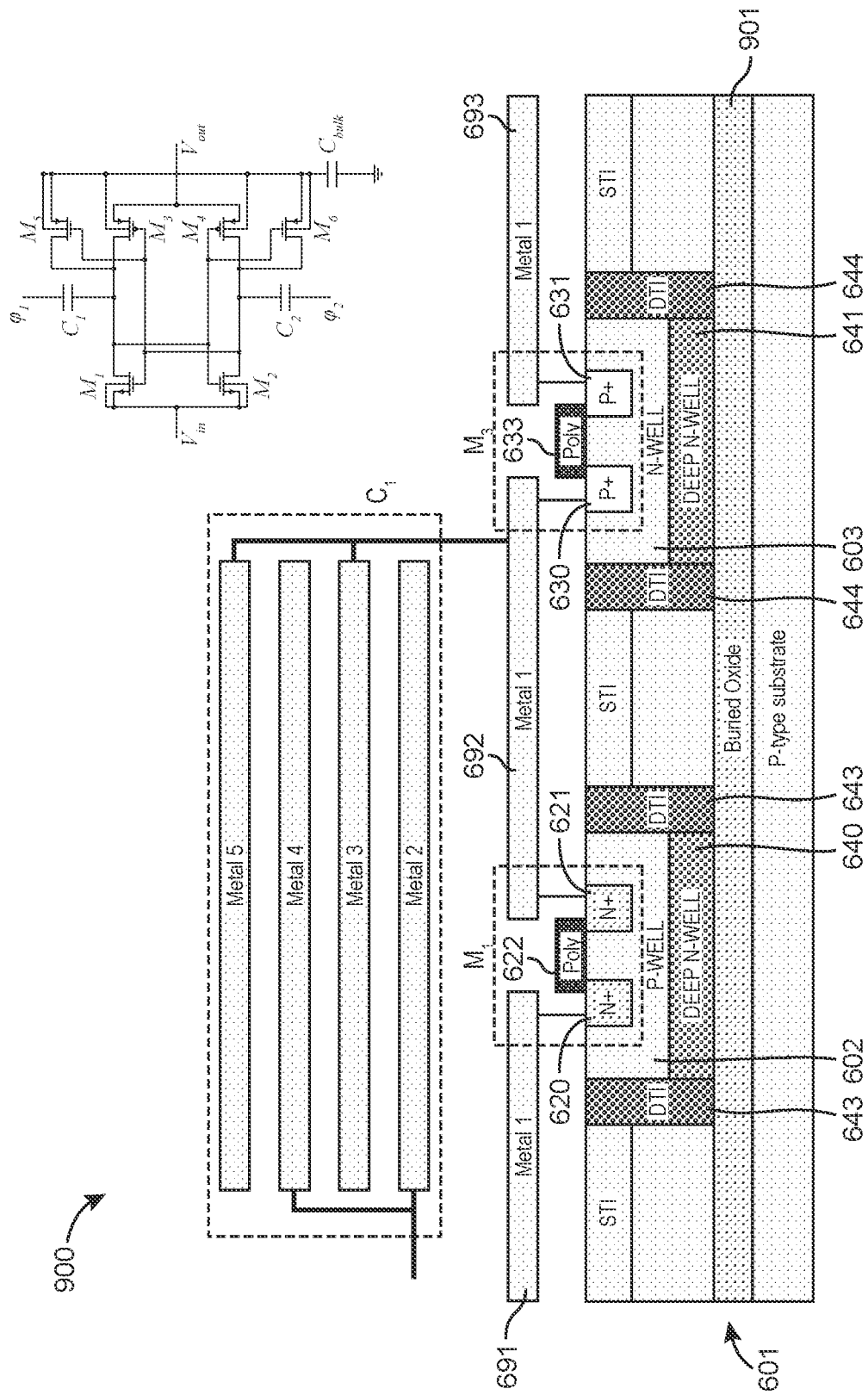
FIG. 9 is a side-cutaway view of a transistor process including DTI and a buried insulation layer.

Referring now to FIG. 9, a second transistor process with deep trench isolation (DTI) 900 is depicted. The second transistor process 900 is similar to the transistor process 600 described with reference to FIG. 6. However, the second transistor process 900 includes a buried insulation layer 901 within the P-type substrate 601. The buried insulation layer 901 may be disposed within the P-type substrate 601 and extend horizontally under the first and second transistors $M_1$ and $M_3$ as one continuous material. In some embodiments, the buried insulation layer 901 may include multiple different sections each arranged to insulate a respective P-well or N-well. The buried insulation layer 901 may include a buried oxide layer, silicon oxide, or other electrically insulative material. The buried insulation layer 901 is positioned adjacent to the first deep N-well 640 and arranged to contact the first DTI 643 as the first DTI extends around the P-well 602 in order to electrically insulate the P-well 102 from the P-type substrate. Further, the buried insulation layer 901 is positioned adjacent to the second deep N-well 641 and arranged to contact the second DTI 644 as the second DTI extends around the N-well 603 in order to electrically insulate the N-well 603 from the P-type substrate. In other words, the buried insulation layer 901 is configured to increase the breakdown voltage the transistors.

Figure 10:
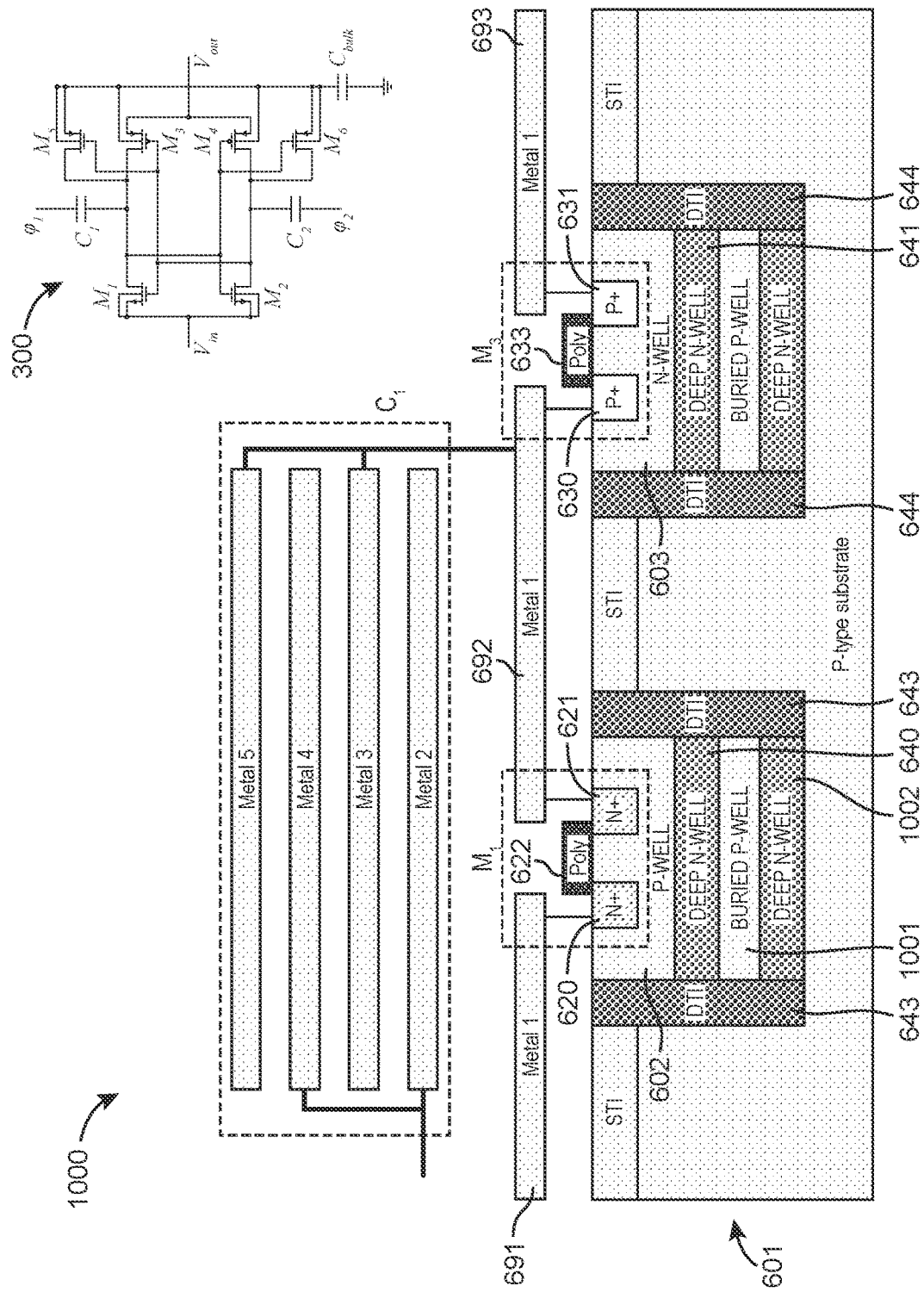
FIG. 10 is a side-cutaway view of a transistor process including DTI and buried wells.

Referring now to FIG. 10, a third transistor process with deep trench isolation (DTI) 1000 is depicted. The third transistor process 1000 is similar to the transistor process 600 described with reference to FIG. 6. The third transistor process 1000 includes buried wells to increase the electrical insulation between the P-well 602 and the substrate and the N-well 603 and the substrate. The buried wells include a buried P-well 1001 disposed or formed on a side of the first deep N-well 640 that is opposite from the side of the first deep N-well 640 that abuts the P-well 602. The buried wells also include a buried N-well 1002 disposed or formed on a side of the buried P-well 1001 that is opposite from the side buried P-well 1001 that abuts the deep N-well 640. The first DTI 643 is configured to extend deep enough into the P-type substrate 601 such that the buried P-well 1001 and the buried N-well 1002 contact the first DTI 643 as the first DTI 643 extends around the P-well 602 (e.g., and the first transistor $M_1$).

The buried wells also include a buried P-well 1011 disposed or formed on a side of the second deep N-well 641 that is opposite from the side of the second deep N-well 641 that abuts the N-well 603. The buried wells also include a buried N-well 1012 disposed or formed on a side of the buried P-well 1011 that is opposite from the side of the buried P-well 1011 that abuts the second deep N-well 641. The second DTI 644 is configured to extend deep enough into the P-type substrate 601 such that the buried P-well 1011 and the buried N-well 1012 contact the second DTI 643 as the second DTI 644 extends around the N-well 603 (e.g., and the second transistor $M_3$).

Figure 11:
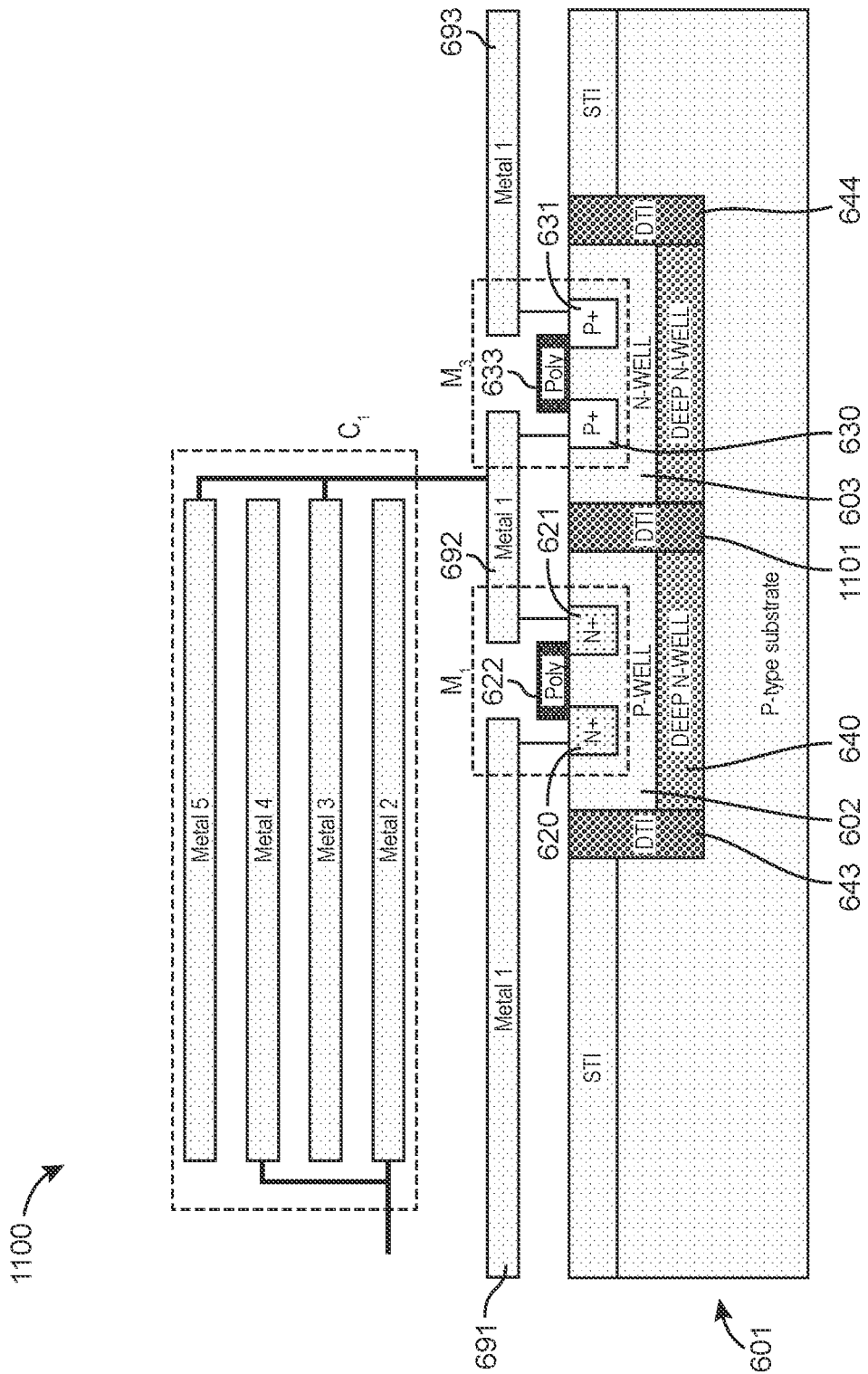
FIG. 11 is a side-cutaway view of a transistor process including a shared DTI.

Referring now to FIG. 11, a fourth transistor process with deep trench isolation (DTI) 1100 is depicted. The fourth transistor process 1100 is similar to the transistor process 600 described with reference to FIG. 6. The fourth transistor process 1100 includes the P-well 602 and the N-well 603 sharing a portion of DTI 1101. The portion of DTI 1101 that is shared may include portions of the P-well 602 and the N-well 603 that are adjacent to one another. In some embodiments, a thickness of the portion of DTI 1101 that is shared is the same thickness of the portions of DTI 643 and 644 that are not shared. In some embodiments, a thickness of the portion of DTI 1101 that is shared is greater than the thickness of the portions of DTI 643 and 644 that are not shared.

Figure 12:
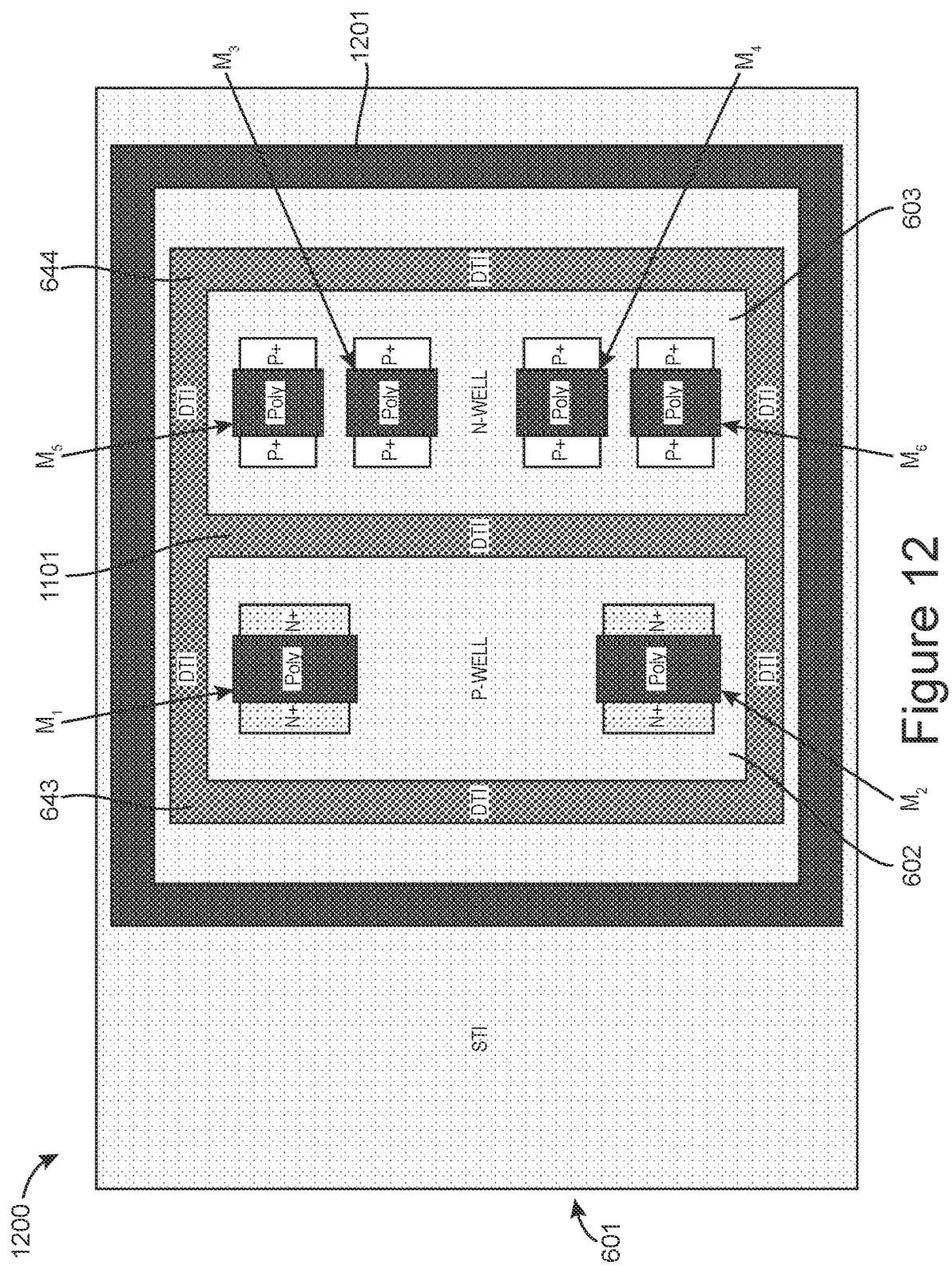
FIG. 12 is a top view of a substrate of a transistor process including a shared DTI.

FIG. 12 depicts a top view of the fourth transistor process 1100 similar and includes the multiple transistors from the charge pump stage 300. The top view of the fourth transistor process 1100 depicts the P-type substrate 601 having the N-well 602 and the P-well 603. The P-well 602 is surrounded by a combination of the first DTI 643 and the portion of DTI 1101 that is shared. The N-well 603 is surrounded by a combination of the second DTI and the portion of DTI 1101 that is shared. That is, on the side (e.g., portions) of the P-well 602 and the N-well 603 that are adjacent, the P-well 602 and the N-well 603 share a DTI 1101. In some embodiments, a third DTI 1201 may be disposed or formed around the exterior of both the first and second DTI 643 and 644 rings. The third DTI 1201 may also be used to increase the breakdown voltages of the transistors.

Figure 13:
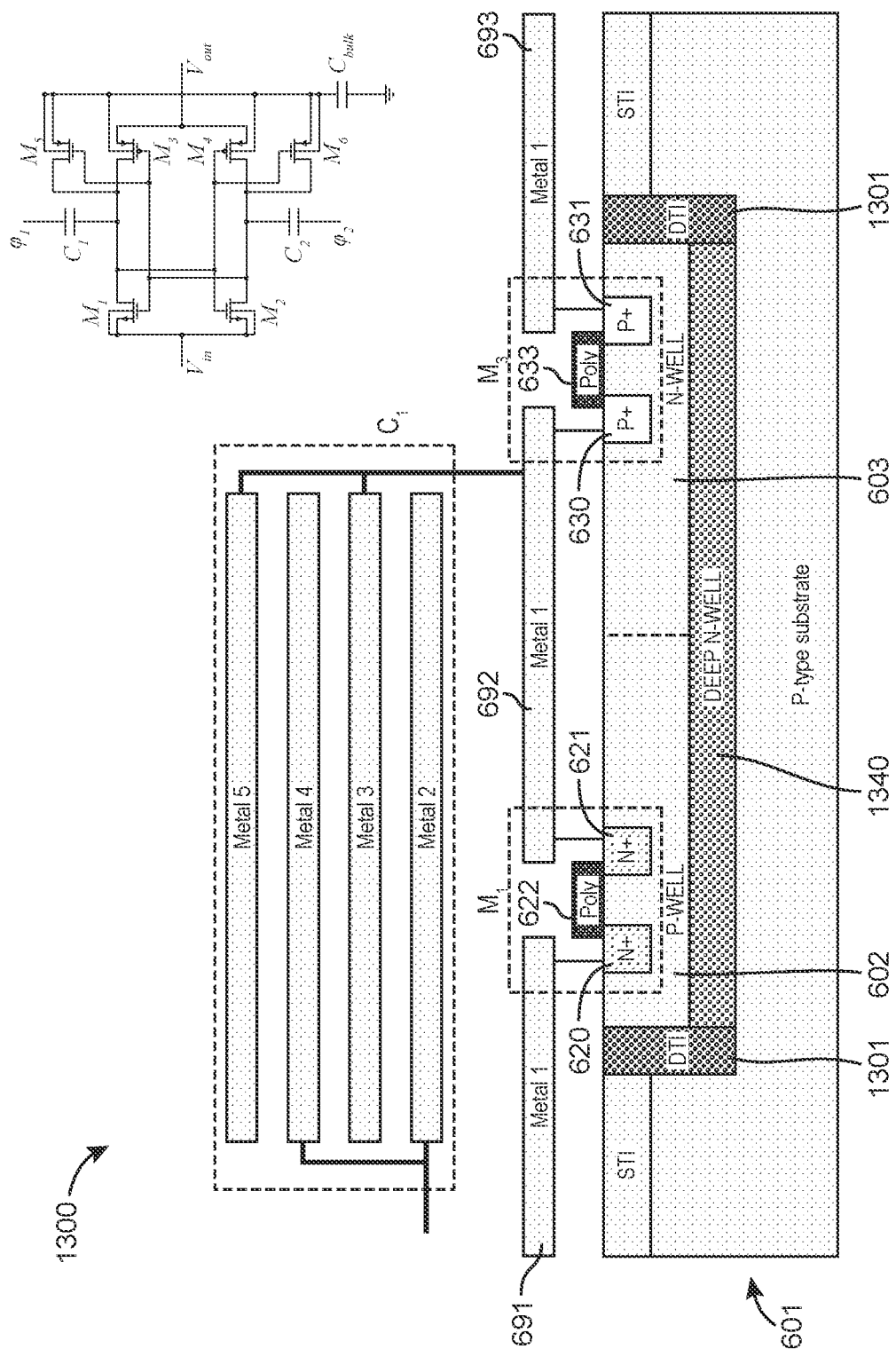
FIG. 13 is a side-cutaway view of a transistor process including a multiple wells within a DTI ring.

Referring now to FIG. 13, a side-cutaway view of a fifth transistor process 1300 including a multiple wells within a DTI ring is shown. The fifth transistor process 1300 is similar to the transistor process 600 described with reference to FIG. 6. The fifth transistor process 1300 includes a P-well 602 and an N-well 603 with a DTI ring 1301 disposed about both the P-well 602 and the N-well 603 (e.g., disposed about a first well region that includes one or more P-well regions and/or N-well regions). That is, in some embodiments, the DTI 1301 may be disposed in a ring (e.g., about a first well region.) that includes one or more P-wells 602 and one or more N-wells 603. In some embodiments, the one or more P-wells 602 and the one or more N-wells 603 may have a shallow trench isolation (STI) barrier disposed between respective N-wells 603 and P-wells 602. In some embodiments, the one or more P-wells 602 and the one or more N-wells 603 do not have a STI or a DTI barrier between adjacent N-wells 603 and/or P-wells 602. In some embodiments, the configuration of size, position, and location of each of the one or more P-wells 602 and the one or more N-wells 603 located within the DTI ring 1301 may vary depending upon the particular application or configuration or type of circuitries being implemented within the microphone assembly.

The fifth transistor process 1300 also includes a deep N-well region 1340 that extends along a first side of the N-well region 603 and the P-well region 602. The deep N-well region 1340 is disposed between the substrate 601 and the N-well and P-well regions 603 and 602. In some embodiments, additional deep well regions or oxide layers may also be used or stacked in order to reduce leakage currents and/or increase the breakdown voltage of the respective transistors (e.g., via electrically insulating the transistors and respective wells from the substrate 601.

Figure 14:
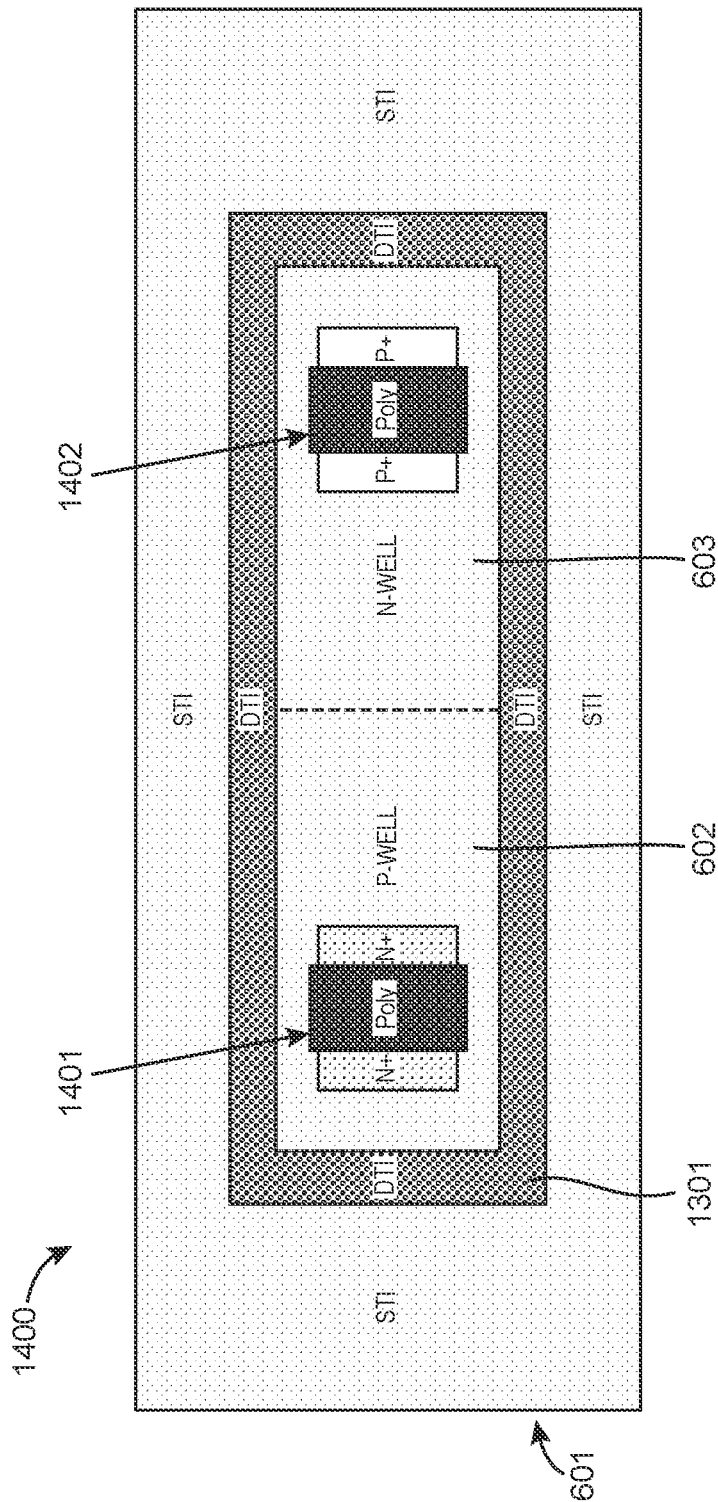
FIG. 14 is a top view of a substrate of a transistor process including a multiple wells within a DTI ring.

Referring now to FIG. 14, a top view of a substrate of a transistor process including a multiple wells within a DTI ring 1400 is shown. The top view of the transistor process including a multiple wells within a DTI ring 1400 depicts the P-type substrate 601 having a P-well region 602 and an N-well region 603 positioned adjacent one another. The P-type substrate also includes a DTI barrier 1301 disposed about or around the P-well region 602 and the N-well region 603. That is, the DTI barrier 1301 extends around a portion of the perimeter of the P-well region 602 and a portion of the perimeters of the N-well region 603. The DTI barrier 1301 is configured to electrically insulate (e.g., in combination with buried layers such as the deep N-well layer 1340) the P-well region 602 and the N-well region 603 from the P-type substrate 601. The N-well region 603 may have one or more transistors 1401 (e.g., or diodes) located within the N-well region 603 and the P-well region 604 may have one or more transistors 1402 located within the P-well region 603. The DTI barrier 1301 increases the breakdown voltage of the transistors 1401 and 1402 and allows for higher voltages (e.g., above 55 volts) to be efficiently reached or used on the transistors.

In some embodiments, the DTI barrier 1301 may extend around or about an area that includes multiple discrete P-well regions 602 and/or multiple discrete N-well regions 603. The multiple P-well regions 602 and the multiple N-well regions 603 may be positioned, located, or arranged in any particular geometry. In some embodiments, each of the multiple P-well regions 602 and the multiple N-well regions 603 may have one or more transistors (e.g., or diodes) located in the respective region. In some embodiments, one or more of the multiple P-well regions 602 and the multiple N-well regions 603 may also have another or respective DTI barrier or ring disposed around the respective region. In some embodiments, the P-well region 602 and the N-well region 603 may have no barrier or a shallow trench isolation barrier disposed therebetween.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. An integrated circuit for interfacing with and conditioning a signal output by a capacitive microelectromechanical systems (MEMS) transducer, the integrated circuit comprising:
    a signal conditioning circuit having an input electrically connectable to an output of a capacitive MEMS transducer, the signal conditioning circuit having an output;
    a transducer bias circuit comprising:
        a charge pump circuit comprising a plurality of cascaded charge pump stages between an input and output of the charge pump, each charge pump stage comprising a capacitor coupled to a first semiconductor device, the first semiconductor device located in a first well region embedded in a substrate and doped with a P or N type material, a first deep trench isolation barrier disposed about the first well region and insulating at least a portion of the first well region from the substrate;
        a high voltage electrostatic discharge protection circuit coupled to the output of the charge pump; and
        a filter coupled to the output of the charge pump.

2. The integrated circuit of claim 1, wherein the capacitor is coupled to a second semiconductor device coupled to the first semiconductor device, the second semiconductor device located in a second well region embedded in the substrate and doped with a P or N type material complementary to the P or N type material of the first well region, a second deep trench isolation barrier disposed about at least a portion of the second well region.

3. The integrated circuit of claim 1, wherein the capacitor is coupled to a second semiconductor device coupled to the first semiconductor device, the second semiconductor device located in a second well region embedded in the substrate and doped with a P or N type material complementary to the P or N type material of the first well region, the first deep trench isolation barrier disposed about at least a portion of the second well region.

4. The integrated circuit of claim 1, wherein the first semiconductor device comprises a diode or a transistor.

5. The integrated circuit of claim 1, wherein the first deep trench isolation barrier is disposed about a periphery of the first well region and a deep well is embedded in the substrate below the first well region.

6. The integrated circuit of claim 1, further comprising an oxide layer buried in the substrate below the first well region and connected to at least a portion of the first deep trench isolation barrier.

7. The integrated circuit of claim 1, further comprising an outer deep trench isolation barrier disposed about the first deep trench isolation barrier.

8. The integrated circuit of claim 1, wherein the transducer bias circuit is configured to output a DC voltage of at least 60 volts when the transducer bias circuit is connected to a power source supplying a DC voltage of 3-6 volts.

9. A capacitive transducer bias circuit comprising:
a charge pump circuit comprising:
a charge pump circuit comprising a plurality of cascaded charge pump stages between an input and output of the charge pump, each charge pump stage comprising a capacitor coupled to a first semiconductor device, the first semiconductor device located in a first well region embedded in a substrate and doped with a P or N type material, a first deep trench isolation barrier disposed about the first well region and insulating at least a portion of the first well region from the substrate;
a high voltage electrostatic discharge protection circuit coupled to the output of the charge pump; and
a filter coupled to the output of the charge pump.

10. The circuit of claim 9, wherein the capacitor is coupled to a second semiconductor device coupled to the first semiconductor device, the second semiconductor device located in a second well region embedded in the substrate and doped with a P or N type material complementary to the P or N type material of the first well region, a second deep trench isolation barrier disposed about at least a portion of the second well region.

11. The circuit of claim 9, wherein the capacitor is coupled to a second semiconductor device coupled to the first semiconductor device, the second semiconductor device located in a second well region embedded in the substrate and doped with a P or N type material complementary to the P or N type material of the first well region, the first deep trench isolation barrier disposed about at least a portion of the second well region.

12. The circuit of claim 9, wherein the first semiconductor device comprises a diode or a transistor.

13. The circuit of claim 9, wherein the first deep trench isolation barrier is disposed about a periphery of the first well region and a deep well is embedded in the substrate below the first well region.

14. The circuit of claim 9, further comprising an oxide layer buried in the substrate below the first well region and connected to at least a portion of the first deep trench isolation barrier.

15. The circuit of claim 9, further comprising an outer deep trench isolation barrier disposed about the first deep trench isolation barrier.

16. A capacitive transducer bias circuit comprising:
a charge pump circuit comprising:
a plurality of cascaded charge pump stages between an input and output, the plurality of cascaded charge pump stages comprising a plurality of semiconductor devices each located within a P-well region or a N-well region of a substrate, the P-well region or the N-well region being electrically insulated from the substrate along a perimeter of the P-well region or the N-well region via a deep trench isolation barrier; and the plurality of cascaded charge pump stages configured to output a direct current (DC) voltage of at least 60 volts;
a high voltage electrostatic discharge protection circuit coupled to the output of the charge pump; and
a filter coupled to the output of the charge pump.

17. The circuit of claim 16, wherein the N-well region is electrically insulated from the substrate via the deep trench isolation barrier and a deep N-well region.

18. The circuit of claim 17, wherein the P-well region is electrically insulated from the substrate via a second deep trench isolation barrier and the deep N-well region.

19. The circuit of claim 16, wherein the deep well isolation trenches are connected to a buried oxide layer, wherein the buried oxide layer and the deep well isolation trench electrically isolate the P-well region from the substrate and the N-well region from the substrate.

20. The circuit of claim 16, further comprising an outer deep trench isolation barrier disposed about the deep trench isolation barrier.

* * * * *